United States Patent
Teng

(10) Patent No.: US 7,655,382 B2
(45) Date of Patent: *Feb. 2, 2010

(54) ON-PRESS DEVELOPABLE LITHOGRAPHIC PRINTING PLATE HAVING DARKER ALUMINUM SUBSTRATE

(76) Inventor: Gary Ganghui Teng, 10 Kendall Dr., Northborough, MA (US) 01532

(*) Notice: Subject to any disclaimer, the term of this patent is extended or adjusted under 35 U.S.C. 154(b) by 73 days.

This patent is subject to a terminal disclaimer.

(21) Appl. No.: 11/604,603

(22) Filed: Nov. 27, 2006

(65) Prior Publication Data

US 2007/0072127 A1    Mar. 29, 2007

Related U.S. Application Data

(63) Continuation-in-part of application No. 11/175,518, filed on Jul. 5, 2005, now Pat. No. 7,348,131.

(51) Int. Cl.
*G03F 7/30* (2006.01)
(52) U.S. Cl. .................................................. 430/302
(58) Field of Classification Search .............. 430/138, 430/270.1, 302
See application file for complete search history.

(56) References Cited

U.S. PATENT DOCUMENTS

| | | | | |
|---|---|---|---|---|
| 4,762,772 A * | 8/1988 | Kobayashi et al. | ........... | 430/309 |
| 5,368,974 A | 11/1994 | Walls | ........................ | 430/156 |
| 5,607,816 A | 3/1997 | Fitzgerald et al. | ......... | 430/271.1 |
| 5,910,395 A | 6/1999 | Li et al. | ...................... | 430/302 |
| 6,014,929 A | 1/2000 | Teng | ........................... | 101/456 |
| 6,136,503 A | 10/2000 | Zheng et al. | .............. | 430/270.1 |
| 6,153,356 A | 11/2000 | Urano et al. | .............. | 430/281.1 |
| 6,232,038 B1 | 5/2001 | Takasaki et al. | .......... | 430/281.1 |
| 6,309,792 B1 | 10/2001 | Hauck et al. | .............. | 430/270.1 |
| 6,331,375 B1 | 12/2001 | Kawamura et al. | ........ | 430/270.1 |
| 6,410,208 B1 * | 6/2002 | Teng | ........................... | 430/302 |
| 6,482,571 B1 * | 11/2002 | Teng | ........................... | 430/302 |
| 6,541,183 B2 * | 4/2003 | Teng | ........................... | 430/303 |
| 6,555,205 B2 * | 4/2003 | Grant et al. | .............. | 428/195.1 |
| 6,576,401 B2 | 6/2003 | Teng | ........................... | 430/303 |
| 6,689,537 B2 | 2/2004 | Urano et al. | .............. | 430/273.1 |
| 6,740,464 B2 * | 5/2004 | Maemoto | .................... | 430/138 |
| 7,348,131 B2 * | 3/2008 | Teng | ........................ | 430/302 |
| 2002/0018962 A1 * | 2/2002 | Urano et al. | .............. | 430/273.1 |
| 2003/0186165 A1 | 10/2003 | Gries et al. | .............. | 430/281.1 |
| 2004/0013968 A1 * | 1/2004 | Teng | ........................ | 430/270.1 |
| 2005/0084797 A1 * | 4/2005 | Vermeersch et al. | ...... | 430/270.1 |
| 2005/0112502 A1 * | 5/2005 | Teng | ........................... | 430/302 |
| 2006/0269873 A1 * | 11/2006 | Knight et al. | ............... | 430/302 |

* cited by examiner

*Primary Examiner*—Cynthia H Kelly
*Assistant Examiner*—Chanceity N Robinson

(57) ABSTRACT

An on-press ink and/or fountain solution developable lithographic printing plate comprising a photosensitive layer over an electrochemically grained, anodized, hydrophilically treated aluminum substrate with a reflection optical density of at least 0.30 is disclosed. The photosensitive layer is soluble or dispersible in ink and/or fountain solution and capable of hardening upon exposure to a laser having a wavelength of from 200 to 1200 nm. The plate is exposed with the laser off press or on press, and then on-press developed with ink and/or fountain solution. Such darker aluminum substrate in combination with the hydrophilic treatment allows fast press roll up, clean background, and good printing durability of the plate.

12 Claims, No Drawings

ON-PRESS DEVELOPABLE LITHOGRAPHIC PRINTING PLATE HAVING DARKER ALUMINUM SUBSTRATE

RELATED PATENT APPLICATIONS

This application is a continuation-in-part application of U.S. patent application Ser. No. 11/175,518 filed Jul. 5, 2005 now U.S. Pat. No. 7,348,131.

FIELD OF THE INVENTION

This invention relates to lithographic printing plates. More particularly, it relates to laser sensitive on-press developable lithographic printing plates having a photosensitive layer over a hydrophilically treated darker aluminum substrate (with higher reflection optical density).

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation. In positive-working systems, the exposed areas become more soluble and can be developed to reveal the underneath substrate. In negative-working systems, the exposed areas become hardened and the non-exposed areas can be developed to reveal the underneath substrate.

The exposed plate is usually developed with a liquid developer. On-press developable lithographic printing plates have been disclosed in the literature. Such plates can be directly mounted on press after exposure to develop with ink and/or fountain solution during the initial prints and then to print out regular printed sheets. No separate development process before mounting on press is needed. Among the patents describing on-press developable lithographic printing plates are U.S. Pat. Nos. 5,258,263, 5,516,620, 5,561,029, 5,616,449, 5,677,110, 5,811,220, 6,014,929, 6,071,675, 6,482,571, 6,737,220, 6,994,028, 6,969,575, and 6,949,327.

Conventionally, the actinic radiation is from a lamp (usually an ultraviolet lamp) and the image pattern is generally determined by a photomask that is placed between the light source and the plate. With the advance of laser and computer technologies, laser sources have been increasingly used to directly expose a lithographic printing plate that is sensitized to a corresponding laser. This allows the elimination of the photomask film, reducing material, equipment and labor cost. Among the lasers used are infrared lasers (about 830 nm or 1064 nm), FD-YAG laser (about 532 nm), argon ion laser (about 480 nm), and violet laser (about 405 nm). Laser diodes (such as violet laser diode of about 405 nm, and infrared laser diode of about 830 nm) are especially useful because of their lower costs.

Among the laser sensitive plates proposed (including silver halide plates, positive plates, and negative plates), photopolymerizable composition based (also called photopolymer) laser sensitive plate is the most desirable because of the high durability of conventional photopolymer plate and its negative-working characteristics (no coated edge on the developed plate when imaged on external drum). However, because the energy output of a laser diode is quite limited and the exposure time of laser for each area is extremely short, it is very difficult to design a laser sensitive photopolymer plate with sufficient photospeed and press durability suitable for commercial applications.

U.S. Pat. No. 6,689,537 describes a violet photopolymer lithographic printing plate wherein a grained and anodized aluminum with higher reflection optical density (from 0.3 to 0.5, by using no or less desmut treatment) is proposed for achieving higher photospeed and improved printing durability. The aluminum substrate is electrochemically grained and anodized, with no or less desmut treatment, and then directly coated with the photosensitive composition. While such a substrate gives higher photospeed and improved press durability, it has the tendency of background toning (inked non-imaging areas) on press, compared to typically clean background for substrate with typical optical density (such as 0.20 to 0.28, with typical desmut treatment). Hydrophilic treatment after the anodization is not used apparently because the hydrophilic treatment generally reduces the photospeed and press durability.

The inventor has found, surprisingly, laser sensitive lithographic plate based on hydrophilically treated electrochemically grained aluminum substrate with an optical density of at least 0.30 can give excellent photospeed and press durability while having clean background. Such a substrate is also found to give excellent performance for laser sensitive on-press developable plate. The combination of higher optical density and hydrophilic treatment is unexpected for laser sensitive plate, because higher optical density is expected to increase photospeed and press durability while hydrophilic treatment is expected to reduce photospeed and press durability.

SUMMARY OF THE INVENTION

This invention provides a laser sensitive on-press ink and/or fountain solution developable lithographic printing plate comprising on an aluminum substrate a photosensitive layer soluble or dispersible in ink and/or fountain solution and capable of hardening upon exposure to a laser; wherein said aluminum substrate is electrochemically grained (with or without desmut treatment), anodized, and further treated with a hydrophilic material, and has a reflection optical density of at least 0.30 (preferably from 0.30 to 1.0, more preferably from 0.32 to 0.70, even more preferably from 0.34 to 0.60, and most preferably from 0.36 to 0.50). The photosensitive layer is sensitive to a laser having a wavelength selected from 200 to 1200 nm, such as a violet laser of about 405 nm, or an infrared laser of about 830 nm. The photosensitive layer preferably comprises an organic resin (polymeric binder or monomer) and a sensitizing dye or pigment; more preferably a polymeric binder and a sensitizing dye or pigment; and most preferably a polymeric binder, a polymerizable monomer, an initiator, and a sensitizing dye. An ink and/or fountain solution soluble or dispersible overcoat can be coated on the photosensitive layer.

This invention further provides a method of imagewise exposing the above lithographic plate with a laser having a wavelength selected from 200 to 1200 nm to cause hardening of the photosensitive layer in the exposed areas, and then developing the above exposed plate with ink and/or fountain solution on a lithographic printing press. The plate can be imaged off press and then mounted on a lithographic press for on-press development with ink and/or fountain solution and lithographic printing. Alternatively, the plate can be imagewise exposed with a laser while mounted on a plate cylinder of a lithographic press, on-press developed on the same plate cylinder with ink and/or fountain solution, and then directly print images to the receiving sheets.

DETAILED DESCRIPTION OF THE PREFERRED EMBODIMENTS

The aluminum substrate suitable for the instant invention can be any aluminum sheet that has been electrochemically grained, anodized, and further treated with a hydrophilic material, with a reflection optical density of at least 0.30, preferably from 0.30 to 1.0, more preferably from 0.32 to 0.70, even more preferably from 0.34 to 0.60, and most preferably from 0.36 to 0.50. The substrate may or may not be subjected to desmut treatment after graining and before anodization.

The reflection optical density (also called optical density in this application) is measured by a reflection optical densitometer for the whole visible region. It measures the absorption of the reflected visible light by the aluminum substrate surface. Darker substrate gives higher reflection optical density. Suitable reflection optical densitometers include, for example, X-Rite and MacBeth reflection optical densitometers.

The aluminum substrate can be prepared from any aluminum sheet, including any pure aluminum or aluminum alloy. Suitable alloys of aluminum include alloys containing minor amounts of any of silicon, iron, copper, manganese, magnesium, zinc, titanium, chromium, nickel and the like.

In addition to electrochemical graining, the substrate can also be subjected to mechanical and/or chemical graining before electrochemical graining. Preferably, the substrate is subjected to electrochemical graining only or both mechanical graining and electrochemical graining (multigraining). All these substrates are considered electrochemically grained substrates in this instant patent.

Electrochemical graining (including multigraining) processes are well known and widely used in the manufacture of lithographic printing plates. There have been a great many different processes of electrochemical graining proposed for use in lithographic printing plate manufacturing. Processes of electrochemical graining are described, for example, in U.S. Pat. Nos. 3,755,116, 3,887,447, 3,935,080, 4,087,341, 4,201,836, 4,272,342, 4,294,672, 4,301,229, 4,396,468, 4,427,500, 4,468,295, 4,476,006, 4,482,434, 4,545,875, 4,548,683, 4,564,429, 4,581,996, 4,618,405, 4,735,696, 4,897,168, 4,919,774, and 5,368,974. All these processes and any other electrochemical graining processes can be used for the electrochemical graining of the instant invention.

Prior to electrochemical graining, the surface of the aluminum is usually cleaned to remove oil, dirt and grease therefrom. Suitable solvents and/or caustic solutions for carrying out such cleaning are well known in the art.

In an electrochemical graining process, the aluminum is treated, so as to increase its surface area and create a specific surface structure, by passing an electric current (usually an alternating electric current) from an electrode through an acid electrolyte to the aluminum. Typically, the aluminum that is conveyed through the electrolyte solution is in the form of a thin continuous web that may have a width of as much as two or more meters.

In carrying out electrochemical graining of aluminum, it is typical to utilize nitric or hydrochloric acid in admixture with the respective aluminum salt thereof. Other acids and many other types of chemical agents are also known for use in electrochemical graining baths. Electrodes, most commonly formed of graphite, are positioned to oppose the aluminum web at a distance ranging from about one-half centimeter to several centimeters. Either single phase or three phase alternating current is passed through the electrolyte so that at the interface between the solution and the aluminum a displacement reaction occurs whereby aluminum is oxidized to form either the chloride or nitrate salt which is soluble in the solution. By removing aluminum with the use of an electric current, a specific surface structure is obtained. Parameters such as temperature, electrolyte concentration, flow rates and electrode spacing are important in determining the characteristics of the surface structure produced.

The electrochemical graining can be carried out in a single-stage, two-stage, or multi-stage electrochemical graining process. For single-stage process, the aluminum passes through a single electrolytic solution, such as a solution comprised of nitric or hydrochloric acid and aluminum chloride, while applied with alternating electricity. For two-stage process, the aluminum passes through two different electrolytic solutions, while applied with alternating electricity; preferably the first stage has greater current density and shorter time than the second stage, as described in U.S. Pat. Nos. 5,122,243 and 5,186,795. For multi-stage process, the aluminum passes through more than one electrolytic solutions, while applied with alternating electricity when in each solution. Single-stage or two-stage electrochemical graining is preferred.

Upon the electrochemical graining process, the aluminum substrate surface changes from the original metallic or shining appearance to dark or gray color, due to the formation of micro structures on the surface as well as the formation of adhering dark particles. Such dark particles are commonly referred to as "smut". The electrochemically grained substrate is generally further etched with an alkaline or acid solution to remove the smut and modify the surface micro structure in order to eliminate ink scumming or toning tendency of the substrate. Such a process is called desmut. Suitable alkaline or acid etching solution for desmut include sodium hydroxide, nitric acid, sodium hydroxide followed by nitric acid (nitric acid also for neutralization), etc. The temperature and/or concentration of the desmut solution can be adjusted to achieve the preferred degree of desmut (degree of removal of the smut and etching of the surface microstructure, as measured by the reduced optical density). In the present invention, reduced degree of desmut (less desmut) or no desmut is preferably used in order to achieve a reflection optical density of 0.30 or higher (as measured for the final substrate used for coating the photosensitive layer); more preferably, less desmut is used. Less aggressive desmut condition, such as nitric acid desmut, lower-concentration sodium hydroxide desmut, lower temperature, or short dwell time can be used. The reduction on reflection optical density through the desmut process (from right after EC graining to right after desmut) is generally less than 0.60, preferably less than 0.40, more preferably less than 0.20, and most preferably less than 0.10, depending on the optical density of the substrate right after EC graining and with an overall object of achieving an optical density of 0.30 or higher for the final substrate.

In the lithographic plate manufacture industry, the concentrations of the standard desmut solutions vary widely for different manufacture lines, depending on the line speed and the length of the desmut bath as well as the smut generated in the EC graining process. For example, certain manufacture lines use 4-6% sodium hydroxide aqueous solution (usually with longer bath and/or less smut), some others use 45-50% sodium hydroxide aqueous solution (usually with shorter bath and/or more smut), and yet some others use 20% nitric acid aqueous solution. Here, the term "lower concentration" of the desmut solution is only relative to the standard concentration of the particular manufacture line. Likewise, the term "less desmut" or "reduced desmut" means that less aggressive desmut condition is used resulting in less reduction in optical density, compared to the standard desmut condition of the particular line. While relatively less desmut (or even no desmut) is generally recommended, any desmut condition can be used in this invention as long as it gives a reflection optical density of 0.30 or higher for the final aluminum substrate.

It is noted that, depending on the EC graining process, the reflection optical density of the EC grained aluminum (without desmut) can be very different. Accordingly, different degrees of desmut or no desmut are needed for aluminum with different EC graining processes, in order to achieve the reflection optical density required by this instant invention.

Upon completion of the electrochemical graining, and further desmut treatment if any, the aluminum is subjected to an anodization process utilizing an acid such as sulfuric acid and/or phosphoric acid. The anodization process serves to form an anodic oxide layer and is preferably controlled to create a layer of at least 0.1 $g/m^2$, more preferably 1 to 8 $g/m^2$, and most preferably 2 to 4 $g/m^2$.

The electrochemically grained (with or without desmut), anodized aluminum is treated with a hydrophilic material to form a hydrophilic barrier layer. Suitable hydrophilic materials include, for example, metal silicate such as sodium silicate, phosphate fluoride (formed from a solution containing sodium dihydrogen phosphate and sodium fluoride, called phosphate fluoride solution), phosphoric acid, and hydrophilic polymer such as polyvinyl phosphonic acid, polyacrylamide, polyacrylic acid, polybasic organic acid, copolymers of vinyl phosphonic acid and acrylamide. Polyvinyl phosphonic acid and its copolymers are preferred polymers. The hydrophilic material is preferably applied to the aluminum as an aqueous solution containing the hydrophilic material. The grained and anodized aluminum is treated with the hydrophilic material by contacting with (preferably by passing through, spraying with, coating with, or dipping in) a solution containing the hydrophilic material, preferably at an elevated or room temperature, such as 20 to 100° C., more preferably 50 to 90° C., and for a certain time, such as 1 to 300 seconds, preferably 5 to 60 seconds. A DC or AC electricity may be applied to the aluminum while passing through or immersed in the solution containing the hydrophilic material. After contacting with the solution containing the hydrophilic material, the aluminum is preferably rinsed with water to remove any excess amount of the hydrophilic material. Processes for forming a hydrophilic barrier layer on aluminum in lithographic printing plate application are well known in the art, and examples can be found in U.S. Pat. Nos. 2,714,066, 4,153,461, 4,399,021, 5,368,974, and 6,555,205.

The aluminum substrate has an average surface roughness Ra of from 0.1 to 1.0 μm, preferably from 0.2 to 0.7 μm, more preferably from 0.3 to 0.6 μm, and most preferably from 0.35 to 0.5 μm. Here the Ra is the average deviation of the "peaks" and "valleys" from the centerline on the substrate surface and is also called arithmetical roughness average. While higher Ra generally allows better adhesion of the photosensitive layer, lower Ra generally allows sharper imaging patterns.

For preparing lithographic printing plates of the current invention, any photosensitive layer is suitable which is capable of hardening upon exposure to a laser having a wavelength selected from 200 to 1200 nm, and is soluble or dispersible in ink and/or fountain solution. Here hardening means becoming insoluble and non-dispersible in ink and/or fountain solution. In this invention, hardening can be achieved through any means, including chemical reactions (such as polymerization, crosslinking, and chemical changes of monomer, polymer or compound) and physical changes (such as coalescence of polymer particles). Preferably, hardening is achieved through chemical reaction (such as polymerization, crosslinking, or chemical change). More preferably, hardening is achieved through crosslinking or polymerization of the resins (polymers or monomers). Most preferably, hardening is achieved through polymerization of the monomers. A laser sensitive dye or pigment is usually used in the photosensitive layer. The photosensitive layer preferably has a coverage of from 100 to 4000 $mg/m^2$, and more preferably from 400 to 2000 $mg/m^2$.

Photosensitive layer suitable for the current invention may be formulated from various photosensitive materials, usually with addition of a sensitizing dye or pigment. The composition ratios (such as monomer to polymer ratio) are usually different from conventional plates designed for development with a regular liquid developer. Various additives may be added to, for example, allow or enhance on-press developability. Such additives include surfactant, plasticizer, water soluble polymer or small molecule, and ink soluble polymer or small molecule. The addition of nonionic surfactant is especially helpful in making the photosensitive layer dispersible with ink and fountain solution, or emulsion of ink and fountain solution. Various additives useful for conventional photosensitive layer can also be used. These additives include pigment, dye, exposure indicator, and stabilizer.

In this patent, the term monomer includes both monomer and oligomer, and the term (meth)acrylate includes both acrylate and methacrylate (A monomer means a monomer or an oligomer, and a (meth)acrylate monomer means an acrylate monomer, a methacrylate monomer, or a monomer with both acrylate and methacrylate groups). The term "comprises a . . . " means "comprises at least one . . . "; for example, the term "comprising a monomer" means "comprising at least one monomer." The term "thermosensitive" means infrared laser sensitive; for example, "thermosensitive layer" means a photosensitive layer that is capable of hardening upon exposure to an infrared laser.

Photosensitive materials useful for the plates of this invention include, for example, photosensitive compositions comprising a polymerizable monomer, an initiator, a sensitizing dye, and optionally a polymer; and photosensitive compositions comprising a polymeric binder and sensitizing dye or pigment.

Infrared laser sensitive (thermosensitive) materials useful for the plates of this invention include, for example, thermosensitive compositions comprising a polymerizable monomer, an initiator, an infrared absorbing dye, and optionally a polymer. Also useful thermosensitive materials are infrared sensitive compositions comprising a crosslinkable polymer and an infrared absorbing dye or pigment. Further useful thermosensitive materials are infrared sensitive compositions comprising a polymer or compound capable of becoming insoluble upon heat and an infrared absorbing dye or pigment. Yet further useful thermosensitive materials are infrared sensitive compositions comprising a polymeric particulate dispersion and an infrared absorbing dye or pigment.

Visible or ultraviolet laser sensitive materials useful for the plates of this invention include, for example, photosensitive compositions comprising a polymerizable monomer, an initiator, a visible or ultraviolet light sensitizing dye, and optionally a polymer. Also useful visible or ultraviolet laser sensitive materials are photosensitive materials comprising a crosslinkable or polymerizable polymeric binder and a visible or ultraviolet laser sensitizing dye, preferably with addition of an initiator.

Violet or ultraviolet laser sensitive materials useful as photosensitive layer of this invention include, for example, photosensitive compositions comprising a polymerizable monomer, an initiator, a violet or ultraviolet sensitizing dye, and optionally a polymeric binder; a hydrogen donor is preferably added to accelerate the polymerization. Also useful violet or ultraviolet laser sensitive materials are photosensitive materials comprising a crosslinkable or polymerizable polymeric binder and a violet or ultraviolet laser sensitizing dye, preferably with addition of an initiator.

Polymeric binder for the photosensitive layer of this invention can be any solid film-forming polymer. The polymer may or may not have (meth)acrylate groups or other ethylenic groups (such as allyl groups). Examples of suitable polymeric binders include (meth)acrylic polymers and copolymers (such as polybutylmethacrylate, polyethylmethacrylate, polymethylmethacrylate, polymethylacrylate, butylmethacrylate/methylmethacrylate copolymer, methylmethacrylate/methylmethacrylic acid copolymer, polyallylmethacrylate, and allylmethacrylate/methacrylic acid copolymer), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, and polyurethane binder. Examples of suitable polymers having ethylenic groups include polymers containing (meth)acrylate groups or allyl groups. Polymers having acetoacetate groups, including, for example, the acetoacetylated polymers as described in U.S. Pat. Nos. 6,919,416 and 7,001,958, can also be used as the polymeric binder in the photosensitive layer of this invention. The polymeric binder suitable for the photosensitive layer of this invention has a weight average molecular weight of at least 5,000, preferably from 10,000 to 1,000,000, more preferably from 20,000 to 500,000, and most preferably from 50,000 to 200,000 Dalton. It is noted that polymeric compounds with weight average molecular weight of less that 5,000 can also be added in the photosensitive layer of this invention; however, in order to avoid confusion, such compounds are not considered as polymeric binder and are called oligomer (without or with ethylenic groups) in this application (oligomers having ethylenic groups are also included in the definition of monomers in this application).

Suitable free-radical polymerizable monomers (including oligomers) for the instant invention include, for example, multifunctional (meth)acrylate monomers or oligomers, such as (meth)acrylate esters of ethylene glycol, trimethylolpropane, pentaerythritol, ethoxylated ethylene glycol and ethoxylated trimethylolpropane; multifunctional urethanated (meth)acrylate; multifunctional epoxylated (meth)acrylate; oligomeric amine diacrylates; and reaction products of a compound having at least one acetoacetate group and a multifunctional (meth)acrylate compound. The monomers can be urethane (meth)acrylate, or non-urethane (meth)acrylate. Combination of both urethane (meth)acrylate and non-urethane (meth)acrylate monomers can be used. Here, urethane (meth)acrylate monomers include any compounds having at least one urethane linkage (—NHCOO—) and at least one (meth)acrylate group; and non-urethane (meth)acrylate monomers include any (meth)acrylate monomers without urethane linkage (—NHCOO—) in the molecule. The monomer for the photosensitive layer of this invention preferably has at least 3 (meth)acrylate groups, more preferably at least 4 (meth)acrylate groups, even more preferably at least 5 (meth)acrylate groups, and most preferably at least 6 (meth)acrylate groups. However, monofunctional or difunctional (meth)acrylate monomer can be added into the photosensitive layer having multifunctional (meth)acrylate monomers; the total amount of such monofunctional or difunctional monomers is preferably less than 50% by weight of the total monomers, more preferably less than 30%, and most preferably less than 10%. Acrylate monomer is preferred over methacrylate monomer because of the faster photospeed of acrylate group over methacrylate group. The monomer has a molecular weight of less than 5,000, preferably from 100 to 3,000, more preferably from 200 to 2,000, and most preferably from 300 to 1,500 Dalton.

The free radical initiators useful for the photosensitive layer of this invention include any initiators capable of generating free radicals or other activating species to cause polymerization of the monomers upon exposure to a laser having a wavelength selected from 200 to 1200 nm, with or without the presence of a sensitizing dye. Suitable free-radical initiators include, for example, onium salts such as diaryliodonium hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl)phenyliodonium hexafluoroantimonate, bis(4-t-butylphenyl)iodonium hexafluorophosphate, triarylsulfonium hexafluorophosphate, triarylsulfonium p-toluenesulfonate, (3-phenylpropan-2-onyl) triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and the borate salts as described in U.S. Pat. Nos. 6,232,038 and 6,218,076; haloalkyl substituted s-triazines such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354; hexaarylbiimidazole compounds such as 2,2'-bis(2-chlorophenyl)-4,4',5,5'-tetraphenyl-1,1'-biimidazole, 2,2'-bis(2-ethoxyphenyl)-4,4',5,5'-tetraphenyl-1,1'-biimidazole, and 2-(1-naphthyl)-4,5-diphenyl-1,2'-biimidazole; and titanocene compounds such as bis($\eta^9$-2,4-cyclopentadien-1-yl) bis[2,6-difluoro-3-(1H-pyrrol-1-yl)phenyl) titanium. For thermosensitive plate, onium salts, borate salts, and s-triazines are preferred free radical initiators; onium salts and borate salts are more preferred; and onium salts (particularly diaryliodonium salts and triarylsulfonium salts) are most preferred. For violet or ultraviolet plate, hexaarylbiimidazole compounds and titanocene compounds are preferred free radical initiators, and hexaarylbiimidazole compounds are more preferred. One or more initiators can be added in a photosensitive layer. The initiator is added in the photosensitive layer preferably at 0.5 to 40% by weight of the photosensitive layer, more preferably at 2 to 30%, and most preferably at 5 to 20%.

Suitable polyfunctional epoxy monomers include, for example, 3,4-epoxycyclohexylmethyl-3,4-epoxycyclohexane carboxylate, bis-(3,4-epoxycyclohexymethyl)adipate, difunctional bisphenol A/epichlorohydrin epoxy resin and multifunctional epichlorohydrin/tetraphenylol ethane epoxy resin.

Suitable cationic initiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating Bronsted acid, they also generate free radicals during photo or thermal decomposition.

Infrared absorbers useful in the thermosensitive layer of this invention include any infrared absorbing dye or pigment effectively absorbing an infrared radiation having a wavelength of 700 to 1,500 nm. It is preferable that the dye or pigment having an absorption maximum between the wavelengths of 750 and 1,200 nm. Various infrared absorbing dyes or pigments are described in U.S. Pat. Nos. 5,858,604, 5,922, 502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. Examples of useful infrared absorbing pigments include black pigments, metal powder pigments, phthalocyanine pigments, and carbon black. Carbon black is a preferred infrared absorbing pigment. Mixtures of dyes, pigments, or both can also be used. Infrared absorbing dye is preferred over infrared absorbing pigment because the infrared absorbing dye usually has higher absorbing efficiency, gives less visible color, and allows molecular level charge or energy transfer to activate the initiator. The infrared dye or pigment is added in the thermosensitive layer preferably at 0.01 to 30% by weight of the thermosensitive layer, more preferably at 0.1 to 20%, and most preferably at 0.5 to 10%.

Visible or ultraviolet sensitizing dyes useful in the visible or ultraviolet sensitive photosensitive layer of this invention include any dyes having a wavelength maximum of from 200 to 600 nm and capable of directly or indirectly causing polymerization of the monomers upon exposure to the corresponding laser. Usually, the visible or ultraviolet dye activates an initiator to cause the polymerization of the monomer upon exposure to a laser. Suitable visible and ultraviolet sensitive dyes include, for example, cyanine dyes (including polymethine dyes); rhodamine compounds such as rhodamine 6G perchloride; chromanone compounds such as 4-diethylaminobenzilidene chromanone; dialkylaminobenzene compounds such as ethyl 4-dimethylaminobenzoate and dialkylaminobenzene; dialkylaminobenzophenone compounds such as 4,4'-bis(dimethylamino)benzophenone, 4,4'-bis(diethylamino)benzophenone, 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5-bis(p-diethylaminophenyl)1,3,4-oxazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl) 1,3,4-thiadiazole, (p-dimethylaminophenyl)pyridine, (p-diethylaminophenyl)pyridine, 2-(p-dimethylaminophenyl)quinoline, 2-(p-diethylaminophenyl)quinoline, 2-(p-dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Dialkylaminobenzene compounds and bis(dialkylamino)benzophenone compounds are particularly suitable for ultraviolet laser sensitive plate. Bis(dialkylamino)benzophenone compounds are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention. The visible or ultraviolet sensitizing dye is added in the photosensitive layer preferably at 0.1 to 20% by weight of the photosensitive layer, more preferably 0.5 to 15%, and most preferably 1 to 10%.

The photosensitive layer of the present invention may contain one or more hydrogen donors as a polymerization accelerator. Examples of the hydrogen donors include compounds having a mercapto group (also called mercapto compounds) such as 2-mercaptobenzothiazole, 2-mercaptobenzimidazole, 2-mercaptobenzoxazole and 3-mercapto-1,2,4-triazole; and N-aryl-α-amino acids, their salts and esters such as N-phenylglycine, salts of N-phenylglycine, and alkyl esters of N-phenylglycine such as N-phenylglycine ethyl ester and N-phenylglycine benzyl ester. Preferred hydrogen donors are 2-mercaptobenzothiazole, 2-mercaptobenzimidazole, 2-mercaptobenzoxazole, 3-mercapto-1,2,4-triazole, N-phenylglycine, N-phenylglycine ethyl ester, and N-phenylglycine benzyl ester. Combination of at least one mercapto compound and at least one N-aryl-α-amino acid or its ester or salt can be advantageously used in the photosensitive layer to increase photospeed. The hydrogen donor is added in the photosensitive layer preferably at 0.01 to 15% by weight of the photosensitive layer, more preferably 0.1 to 10%, and most preferably 0.5 to 5%.

Various surfactants can be added into the photosensitive layer to allow or enhance the on-press developability with ink and/or fountain. Both polymeric and small molecule surfactants can be used. However, it is preferred that the surfactant has low or no volatility so that it will not evaporate from the photosensitive layer of the plate during storage and handling. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 30% by weight of the photosensitive layer, more preferably from 0.5 to 20%, and most preferably from 1 to 15%.

For plates with rough and/or porous surface, a thin releasable interlayer can be deposited between the substrate and the photosensitive layer. Preferably, the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is the preferred water-soluble polymer. Usually pure water-soluble polymer is coated. However, one or more surfactant and other additives may be added. The water-soluble polymer is generally coated from an aqueous solution with water as the only solvent. A water-soluble organic solvent, preferably an alcohol such as ethanol or isopropanol, can be added into the water-soluble polymer aqueous coating solution to improve the coatability. The alcohol is preferably added at less than 40% by weight of the solution, more preferably at less than 20%, and most preferably at less than 10%. The releasable interlayer preferably has an average coverage of 1 to 200 mg/m$^2$, more preferably 2 to 100 mg/m$^2$, and most preferably 4 to 40 mg/m$^2$. The substrate preferably has an average surface roughness Ra of 0.2 to 2.0 microns, and more preferably 0.4 to 1.0 microns.

The photosensitive layer can be conformally coated onto a roughened substrate (for example, with Ra of larger than 0.4 microns) at thin coverage (for example, of less than 1.2 g/m$^2$) so that the plate can have microscopic peaks and valleys on the photosensitive layer coated surface and exhibit low tackiness and good block resistance, as described in U.S. Pat. No. 6,242,156, the entire disclosure of which is hereby incorporated by reference.

An ink and/or fountain solution soluble or dispersible overcoat can be coated on the photosensitive layer for the plate of this invention to, for example, improve the photospeed, surface durability, and/or on-press developability. Particularly preferred overcoat is a water soluble or dispersible overcoat. The overcoat preferably comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) can also be used. Polyvinyl alcohol is a preferred water-soluble polymer. Various additives, such as surfactant, wetting agent, defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic emulsion or dispersion may be added into the overcoat to, for example, reduce the tackiness or moisture sensitivity of the plate. The overcoat preferably has a coverage of from 0.001 to 3.0 g/m$^2$, more preferably from 0.005 to 1.0 g/m$^2$, and most preferably from 0.01 to 0.5 g/m$^2$.

A preferred thermosensitive lithographic plate of this invention comprises on a substrate a thermosensitive layer comprising a polymeric binder (with or without ethylenic groups), a free radical polymerizable monomer having at least one terminal ethylenic group, a free-radical initiator, and an infrared absorbing dye. A nonionic surfactant is preferably added in the thermosensitive layer. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. The monomer preferably has at least 3 (meth)acrylate groups, more preferably at least 4 (meth)acrylate groups, even more preferably at least 5 (meth)acrylate groups, and most preferably at least 6 (meth)acrylate groups. The monomer can be a urethane (meth)acrylate monomer or a non-urethane (meth)acrylate monomer; preferably the monomer is a urethane (meth)acrylate monomer; more preferably both a non-urethane (meth)acrylate monomer and a urethane (meth)acrylate monomer are used in the photosensitive layer. One or more other monomers can be added in the photosensitive layer. The weight ratio of all the monomers to all the polymeric binders is preferably larger than 0.5, more preferably larger than 1.0, even more preferably larger than 1.5, and most preferably larger than 2.0. An ink and/or fountain solution soluble or dispersible overcoat is preferably coated on the photosensitive layer.

Another preferred thermosensitive lithographic plate of this invention comprises on a substrate a thermosensitive layer comprising a polymeric binder, a urethane monomer having at least 3 (meth)acrylate groups, a non-urethane monomer having at least 3 (meth)acrylate groups, a free-radical initiator, and an infrared absorbing dye. Preferably, the urethane monomer has at least 4 (meth)acrylate groups, and the non-urethane monomer has at least 4 (meth)acrylate groups. More preferably, the urethane monomer has at least 6 (meth)acrylate groups. A nonionic surfactant is preferably added. One or more other monomers can be added in the photosensitive layer. The weight ratio of all the urethane (meth)acrylate monomer to all the non-urethane (meth)acrylate monomer is preferably from 0.10 to 10.0, more preferably 0.30 to 1.0. An ink and/or fountain solution soluble or dispersible overcoat is preferably coated on the photosensitive layer.

A third preferred thermosensitive lithographic plate of this invention comprises on a substrate a thermosensitive layer comprising an epoxy or vinyl ether monomer having at least one epoxy or vinyl ether group, a Bronsted acid generator capable of generating free acid in the presence of an infrared absorbing dye or pigment upon exposure to an infrared radiation, and an infrared absorbing dye or pigment (preferably infrared absorbing dye). A polymeric binder is preferably added. Other additives such as surfactant, dye or pigment, exposure-indicating dye, and acid quencher (usually an alkaline compound, such as tetrabutylammonium hydroxide or triethylamine) may be added.

A fourth preferred thermosensitive lithographic plate of this invention comprises on a substrate a thermosensitive layer comprising a polymeric binder and an infrared absorbing dye or pigment (preferably infrared absorbing dye); said thermosensitive layer is developable with ink and/or fountain solution and capable of hardening through crosslinking of the polymeric binder upon exposure to an infrared laser. A nonionic surfactant and/or a water-soluble polymer are preferably added in the thermosensitive layer. Other additives such as other surfactant, dye or pigment, and exposure indicating dye can also be added.

A fifth preferred thermosensitive lithographic plate of this invention comprises on a substrate a thermosensitive layer comprising a polymeric particles and an infrared absorbing dye or pigment (preferably infrared absorbing dye); said thermosensitive layer is developable with ink and/or fountain solution and capable of hardening through coalescence of the polymer particles upon exposure to an infrared laser. A nonionic surfactant and/or a water-soluble polymer are preferably added in the thermosensitive layer. Other additives such as other surfactant, dye or pigment, and exposure indicating dye can also be added.

A preferred visible or ultraviolet light sensitive lithographic printing plate of this invention comprises on a substrate a photosensitive layer comprising a polymeric binder (with or without ethylenic groups), a free radical polymerizable monomer having at least one terminal ethylenic group, a free-radical initiator, and a visible or ultraviolet sensitizing dye. A nonionic surfactant is preferably added in the photosensitive layer. Other additives such as surfactant, dye or pigment, exposure-indicating dye, and free-radical stabilizer may be added. The monomer preferably has at least 3 (meth) acrylate groups, more preferably at least 4 (meth)acrylate groups, even more preferably at least 5 (meth)acrylate groups, and most preferably at least 6 (meth)acrylate groups. The monomer can be a urethane (meth)acrylate monomer or a non-urethane (meth)acrylate monomer; preferably the monomer is a urethane (meth)acrylate monomer; more preferably both a non-urethane (meth)acrylate monomer and a urethane (meth)acrylate monomer are used in the photosensitive layer. One or more other monomers can be added in the photosensitive layer. The weight ratio of all the monomers to all the polymeric binders is preferably larger than 0.5, more preferably larger than 1.0, even more preferably larger than 1.5, and most preferably larger than 2.0. An ink and/or fountain solution soluble or dispersible overcoat is preferably coated on the photosensitive layer.

Another preferred visible or ultraviolet light sensitive lithographic plate of this invention comprises on a substrate a photosensitive layer comprising a polymeric binder, a urethane monomer having at least 3 (meth)acrylate groups, a non-urethane monomer having at least 3 (meth)acrylate groups, a free-radical initiator, and a visible or ultraviolet sensitizing dye. Preferably, the urethane monomer has at least 4 (meth)acrylate groups, and the non-urethane monomer has at least 4 (meth)acrylate groups. More preferably, the urethane monomer has at least 6 (meth)acrylate groups. A nonionic surfactant is preferably added. One or more other monomers can be added in the photosensitive layer. The weight ratio of all the urethane (meth)acrylate monomer to all the non-urethane (meth)acrylate monomer is preferably from 0.10 to 10.0, more preferably 0.30 to 1.0. An ink and/or fountain solution soluble or dispersible overcoat is preferably coated on the photosensitive layer.

A preferred violet or ultraviolet light sensitive lithographic plate of this invention comprises on a substrate a photosensitive layer comprising a polymeric binder, a free radical polymerizable monomer having at least one terminal ethylenic group, a free-radical initiator, and a violet or ultraviolet sensitizing dye. A hydrogen donor is preferably added to increase the photospeed. A nonionic surfactant is preferably added to enhance on-press developability. Other additives such as surfactant, dye or pigment, exposure-indicating dye, and free-radical stabilizer may be added. The monomer preferably has at least 3 (meth)acrylate groups, more preferably at least 4 (meth)acrylate groups, even more preferably at least 5 (meth) acrylate groups, and most preferably at least 6 (meth)acrylate groups. The monomer can be a urethane (meth)acrylate monomer or a non-urethane (meth)acrylate monomer; preferably the monomer is a urethane (meth)acrylate monomer; more preferably both a non-urethane (meth)acrylate monomer and a urethane (meth)acrylate monomer are used in the photosensitive layer. One or more other monomers can be added in the photosensitive layer. The weight ratio of all the monomers to all the polymeric binders is preferably larger than 0.5, more preferably larger than 1.0, even more preferably larger than 1.5, and most preferably larger than 2.0. An ink and/or fountain solution soluble or dispersible overcoat is preferably coated on the photosensitive layer.

Another preferred violet or ultraviolet laser sensitive lithographic plate of this invention comprises on a substrate a photosensitive layer comprising a polymeric binder, a monomer having at least 3 (meth)acrylate group, a hexaarylbiimidazole or titanocene compound, a dialkylaminobenzophenone compound, and a hydrogen donor. A hexaarylbiimidazole compound is preferred among hexaarylbiimidazole and titanocene compounds. A preferred dialkylaminobenzophenone compound is a 4,4'-bis(dialkylamino) benzophenone compound. Said monomer is preferably a urethane (meth)acrylate monomer. More preferably, said monomer is a urethane (meth)acrylate monomer and said photosensitive layer further comprises a non-urethane (meth) acrylate monomer. Even more preferably, said photosensitive layer comprises a urethane monomer with at least 3 (meth) acrylate groups and a non-urethane monomer with at least 3 (meth)acrylate groups. Most preferably, said photosensitive layer comprises a urethane monomer with at least 4 (meth) acrylate groups and a non-urethane monomer with at least 4 (meth)acrylate groups. A nonionic surfactant is preferably added in the photosensitive layer. The weight ratio of all the monomers to all the polymeric binders is preferably larger than 0.5, more preferably larger than 1.0, even more preferably larger than 1.5, and most preferably larger than 2.0. An ink and/or fountain solution soluble or dispersible overcoat is preferably coated on the photosensitive layer.

As for all the photosensitive layer of this invention, the above photosensitive layers (including thermosensitive layers) are soluble or dispersible in ink and/or fountain solution, so that they can be on-press developed with ink and/or fountain solution. The substrate for all the lithographic plate of this invention, including the substrate described in the above specific plates, is an electrochemically grained (with or without desmut), anodized, and hydrophilically treated aluminum substrate having a reflection optical density of at least 0.30 (preferably from 0.30 to 1.0, more preferably from 0.32 to 0.70, even more preferably from 0.34 to 0.60, and most preferably from 0.36 to 0.50).

On-press developable photosensitive layers as described in U.S. Pat. Nos. 6,482,571, 6,576,401, 5,548,222, 6,541,183, 6,551,757, 6,899,994 and 6,949,327, and U.S. patent application Ser. Nos. 11/075,663, 11/175,518, 11/266,817, 11/336,132, and 11/356,911, the entire disclosures of which are hereby incorporated by reference, can be used for the instant invention.

Hydrophilic or oleophilic micro particles can be added into the photosensitive layer to enhance, for example, the developability and non-tackiness of the plate. Suitable micro particles include polymer particles, talc, titanium dioxide, barium sulfate, silicone oxide, and aluminum micro particles, with an average particle size of less than 10 microns, preferably less than 5 microns, more preferably less than 2 microns, and most preferably less than 1 microns. A suitable particulate dispersion is described in U.S. Pat. No. 6,071,675, the entire disclosure of which is hereby incorporated by reference.

Infrared lasers useful for the imagewise exposure of the thermosensitive plates of this invention include laser sources emitting in the near infrared region, i.e. emitting in the wavelength range of from 750 to 1200 nm, and preferably from 800 to 1100 nm. Particularly preferred infrared laser sources are laser diodes emitting around 830 nm or a NdYAG laser emitting around 1060 nm. The plate is exposed at a laser dosage that is sufficient to cause hardening in the exposed areas but not high enough to cause substantial thermal ablation. The exposure dosage is preferably from 1 to 1000 $mJ/cm^2$, more preferably from 5 to 500 $mJ/cm^2$, and most preferably from 20 to 200 $mJ/cm^2$, depending on the sensitivity of the thermosensitive layer.

Visible lasers (including violet laser) useful for the imagewise exposure of the visible light sensitive plates of this invention include any laser emitting in the wavelength range of from 390 to 600 nm. Examples of suitable visible lasers include frequency-doubled Nd/YAG laser (about 532 nm), argon ion laser (about 488 nm), violet diode laser (about 405 nm), and visible LEDs. Violet laser diode is especially useful because of its small size and relatively low cost. The exposure dosage is preferably from 1 to 1000 µJ/cm$^2$ (0.001 to 1 mJ/cm$^2$), more preferably from 5 to 500 µJ/cm$^2$, and most preferably from 20 to 200 µJ/cm$^2$, depending on the sensitivity of the photosensitive layer.

Violet or ultraviolet lasers useful for the imagewise exposure of the plates of this invention include any lasers having a wavelength of from 200 to 430 nm, such as violet laser diodes having a wavelength of from 390 to 430 nm, and ultraviolet laser diodes or LEDs having a wavelength of from 200 to 390 nm. Laser diodes are preferred violet or ultraviolet lasers. The exposure dosage is preferably from 1 to 1000 µJ/cm$^2$ (0.001 to 1 mJ/cm$^2$), more preferably from 5 to 500 µJ/cm$^2$, and most preferably from 20 to 200 µJ/cm$^2$, depending on the sensitivity of the photosensitive layer.

The plate is usually exposed on an exposure device, and then mounted on press to develop with ink and/or fountain solution and then print out regular printed sheets. However, the plate can also be exposed on a printing press (such as by mounting on the plate cylinder or sliding through a flatbed imager mounted on the press), and the exposed plate can be directly developed on press with ink and/or fountain solution and then print out regular printed sheets. The ink and/or fountain solution solubilized or dispersed photosensitive layer and/or overcoat can be mixed into the ink and/or the fountain solution on the rollers, and/or can be transferred to the blanket and then the receiving medium (such as paper). The fountain solution roller is engaged (to the plate cylinder as for conventional inking system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium (such as paper). Good quality prints should be obtained preferably under 40 initial impressions, more preferably under 20 impressions, and most preferably under 5 impressions.

For conventional wet press, usually fountain solution is applied (to contact the plate) first, followed by contacting with ink roller. For press with integrated inking/dampening system, the ink and fountain solution are emulsified by various press rollers before being transferred to the plate as emulsion of ink and fountain solution. However, in this invention, the ink and fountain solution may be applied at any combination or sequence, as needed for the plate. There is no particular limitation. The recently introduced single fluid ink that can be used for printing wet lithographic plate without the use of fountain solution, as described in for example U.S. Pat. No. 6,140,392, can also be used for the on-press development and printing of the plate of this invention.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing: Science and Technology" by Pappas, Plenum Press, New York, 1992.

The fountain solution used in this application can be any fountain solution used in lithographic printing. Fountain solution is used in the wet lithographic printing press to dampen the hydrophilic areas (non-image areas), repelling ink (which is hydrophobic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. However, for certain plates, mildly basic fountain solution is used. The type of fountain solution used depends on the type of plate substrate as well as the photosensitive layer. Various fountain solution compositions are described in U.S. Pat. Nos. 4,030,417 and 4,764,213.

The laser exposed plate may be rinsed or applied with an aqueous solution, including water and fountain solution, to remove the water soluble or dispersible overcoat and to dampen without developing the plate, after imagewise exposure and before on-press development with ink and/or fountain solution.

The laser exposed plate can be treated with a deactivating agent to deactivate the photo hardening capability of the photosensitive layer after laser exposure and before development, so that the non-exposed areas will not be hardened by the room light during handling or storage, as described in U.S. patent application Ser. Nos. 11/266,817 and 11/356,911, the entire disclosure of which is hereby incorporated by reference.

The deactivating agent can be any material that can deactivate the photo hardening capability of the photosensitive layer. It can be a solid or liquid organic or inorganic compound, such as organic or inorganic acid, base, oxidizer, or reducer. The deactivating agent can be applied from a solution (based on water or organic solvent) to the photosensitive layer (with or without overcoat). Preferably, the deactivating agent is soluble in water and is applied from an aqueous solution. A water-soluble organic solvent, such as ethylene glycol, can be added into the aqueous solution. Certain additives, such as dye, dispersed pigment, bactericide, stabilizer, reducer, thickening agent, and surfactant, can be added. For free radical polymerizable photosensitive layer, the deactivating agent can be a compound that can react with a component of the free radical initiating system (such as initiator, sensitizing dye, or hydrogen donor).

The solution containing the deactivating agent can be applied to the photosensitive layer of the plate through any means, such as spray, dipping, roller coating, slot coating, etc. For plate with an overcoat, the deactivating solution can be applied with or without the overcoat being removed first. When the overcoat is not removed before applying the deactivating solution, the deactivating solution may penetrate through the overcoat without removing the overcoat, or partially or completely remove the overcoat.

For photosensitive layer having an amine group in the initiator, sensitizing dye, or hydrogen donor, an acid compound (including organic acid and inorganic acid) can be used as the deactivating agent. Suitable organic acids include, for example, organic compounds having at lease one carboxylic acid group, a sulfonic acid group, or phosphonic acid group. Suitable inorganic acids include, for example, phosphoric acid, boric acid, and hydrochloride acid. Preferred acids are those with moderate acidity, such as carboxylic acid-functional organic compounds, phosphoric acid, and boric acid. Water-soluble organic compounds having at least one carboxylic acid group are preferred organic acids. Suitable organic acids include, for example, citric acid, acetic acid, salicylic acid, glycolic acid, malic acid, and lactic acid. Citric acid and malic acid are particularly suitable because they are widely used natural organic acids and are non-hazardous to the environment. The acid is preferably applied as aqueous solution to deactivate the photosensitive layer. When strong acid (such as hydrochloride acid) is used as deactivating agent, it is preferably diluted to low concentration (such as less than 0.5%, preferably less than 0.1% by weight) in an aqueous solution to apply to the plate so that it does not damage the plate or cause safety problem.

Alkaline compound can also be used as the deactivating agent for certain free radical polymerizable photosensitive layer because it can react with certain free radical initiating system (initiator, sensitizing dye, or hydrogen donor). For example, an alkaline compound can react with a hydrogen donor having carboxylic acid or thiol group. Suitable alkaline compounds include, for example, sodium silicate, potassium silicate, sodium carbonate, sodium hydroxide, and organic amines. Preferred alkaline compounds are water-soluble compounds with moderate basicity, such as sodium silicate, potassium silicate, ammonium hydroxide, and amines. Suitable water-soluble amines include regular amine compounds such as triethylamine, triethanolamine, 2-amino-2-methyl-1-propanol, tris(hydroxymethyl)aminomethane and N-methyl-2-pyrrolidone, and polymeric amines such as polyethyleneamine. The alkaline compound is preferably applied as an aqueous solution to deactivate the photosensitive layer. When strong base (such as sodium hydroxide) is used as deactivating agent, it is preferably diluted to low concentration (such as less than 0.5%, preferably less than 0.1% by weight) in an aqueous solution so that it does not damage the plate or cause safety problem.

The laser exposure and the on-press development can be independently performed with the plate under a lighting that contains substantially no radiation below a wavelength selected from 400 to 650 nm, or in substantial darkness; preferably under a lighting that contains no radiation below a wavelength selected from 400 to 650 nm, or in darkness. Such lighting is usually a yellow or red light. This includes a light that is from a fluorescence or incandescent lamp that is covered with a filter that cuts off substantially all (at least 90%, preferably 99%) of the radiation below a wavelength selected from 400 to 650 nm; preferably the lamp is covered with a filter that cuts off all of the radiation below a wavelength selected from 400 to 650 nm. The laser exposure and the on-press development can be performed with the plate under the same or different lightings.

This invention is further illustrated by the following non-limiting examples of its practice.

Examples 1-10

Two aluminum sheets (3 in.×6 in.×0.008 in.) were degreased by dipping in a 3.0% by weight sodium hydroxide aqueous solution for 2 minutes and rinsed with running water. The degreased aluminum sheets were then placed face-to-face at 2 inches apart in a 2.0% by weight hydrochloric acid aqueous solution. Each aluminum sheet was connected to one of the two outputs of an AC electric source. AC current of about 8 Ampere (at about 80 Volt) was passed through for 60 seconds. The electrochemically grained (EC grained) aluminum sheets were then rinsed with running water. Multiple sheets of EC grained aluminum were prepared according to this procedure. The EC grained aluminum sheets prepared above were subjected to different desmut treatments for about 5 seconds as described in Table 1.

The EC grained aluminum substrates (with or without desmut) were subjected to DC electrochemical anodization at 12 volt in a 20% by weight sulfuric acid aqueous solution for 60 seconds, followed by running tap water rinse. The grained and anodized aluminum sheets were immersed in a 0.1% by weight polyvinyl phosphonic acid (PVPA) aqueous solution at 80° C. for 4 minutes, followed by rinse with running water and drying in an oven at 110° C. for 2 minutes.

Aluminum sheets without desmut and/or PVPA treatments were also prepared at the same time as controls.

The reflection optical densities of the substrates were measured with an X-Rite reflection optical densitometer using visible mode (clear mode). The optical densities as well as the treatments of the samples (including the controls) are listed in Table 1.

The above treated aluminum sheets were first coated with a 0.2% by weight aqueous solution of polyvinyl alcohol (Celvol 540, from Celanese) with a #6 Meyer rod, followed by drying in an oven at 110° C. for 2 min. The polyvinyl alcohol coated substrate was further coated with the photosensitive layer formulation PS-1 with a #8 Meyer rod, followed by drying in an oven at 110° C. for 2 min.

PS-1

| Component | Weight ratios |
|---|---|
| Neocryl B-728 (Polymer from Zeneca) | 3.193 |
| Sartomer SR-399 (Acrylic monomer from Sartomer) | 7.630 |
| Pluronic L43 (Nonionic surfactant from BASE) | 0.649 |
| 2,2-Bis(2-chlorophenyl)-4,4',5,5'-tetraphenyl-1,1'-biimidazole | 1.407 |
| 4,4'-Bis(diethylamino)benzophenone | 0.839 |
| 2-Mercaptobenzoxazole | 0.281 |
| 2-Butanone | 86.000 |

The photosensitive layer coated plate was further coated with a water-soluble overcoat OC-1 using a #6 Meyer rod, followed by drying in an oven at 110° C. for 2 min. The above coating and drying processes were under a dim yellow light.

OC-1

| Component | Weight ratios |
|---|---|
| Airvol 203 (Polyvinyl alcohol from Air Products) | 5.00 |
| Zonyl FSO (Perfluorinated surfactant from DuPont) | 0.02 |
| Water | 95.00 |

The above plates were exposed with a violet plate imager equipped with a 60-mw violet laser diode emitting at about 405 nm (MAKO-4 from ECRM) for a dosage of about 120 μJ/cm$^2$. Each plate is taped onto a larger plate (10 in.×15 in.) to pass through the flatbed imager. The plate was imaged in an orange light room (with a cut off wavelength of 530 nm), and was kept in a light tight box before and after imaging.

The exposed plates were tested on a wet lithographic press (AB Dick 360) under a dim yellow light. The plate was directly mounted on the plate cylinder of the press using double-sided adhesive tapes. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper. The press continued to run for 200 impressions. The printed sheets were evaluated for the cleanness of the non-imaging areas (background) and the image durability. The results are summarized in Table 1.

TABLE 1

| Sample ID | Desmut Solution | PVPA Treatment | Reflection Optical Density | Back-ground | Image Durability |
|---|---|---|---|---|---|
| A | 20% NaOH | Yes | 0.26 | Clean | Poor |
| B | 2% NaOH | Yes | 0.38 | Clean | Good |
| C | 20% Nitric acid | Yes | 0.37 | Clean | Good |
| D | 10% Nitric acid | Yes | 0.43 | Clean | Good |
| E | No desmut | Yes | 0.48 | Clean | Good |
| F | 20% NaOH | No | 0.26 | Toning | Good |
| G | 2% NaOH | No | 0.39 | Inked | Good |
| H | 20% Nitric acid | No | 0.37 | Inked | Good |
| I | 10% Nitric acid | No | 0.44 | Inked | Good |
| J | No desmut | No | 0.49 | Inked | Good |

Example 11

An electrochemically grained (with nitric acid desmut), anodized, and silicate treated aluminum sheet with a reflection optical density of 0.34 was coated with thermosensitive layer formulation PS-2 using a #8 Meyer rod, followed by drying in an oven at 90° C. for 2 min.

| PS-2 | |
|---|---|
| Component | Weight ratios |
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| 2,4-Bis(trichloromethyl)-6-[(4-ethoxyethylenoxy)-phen-1-yl]-s-triazine | 1.00 |
| ADS-830AT (Infrared absorbing cyanine dye from American Dye Source) | 0.10 |
| Acetone | 90.0 |

The thermosensitive layer coated plate was further coated with a water-soluble overcoat OC-1 using a #6 Meyer rod, followed by drying in an oven at 90° C. for 2 min.

The plate was exposed with an infrared laser imager equipped with laser diodes emitting at about 830 nm (Trendsetter from Creo) at a dosage of 250 mJ/cm$^2$. The exposed plate was directly mounted on the plate cylinder of a lithographic press (Multigraphics 1250). After starting the press, the fountain roller was engaged for 20 rotations, the ink roller was engaged for 20 rotations, and the plate cylinder was then engaged with the blanket cylinder and printed with paper for 2000 impressions. The printed sheets showed good inking, clean background, and a resolution of 2-98%.

Example 12

Comparative Example for Example 11

The plate is the same as in Example 11 except that an electrochemically grained (with sodium hydroxide desmut), anodized, silicate treated aluminum substrate with a reflection optical density of 0.25 was used. The plate was tested the same as in Example 11. The plate gave clean background but poor inking and poor durability (10% dots lost).

I claim:

1. A method of processing a lithographic printing plate comprising in order:
   (a) providing a lithographic printing plate comprising on an aluminum substrate a photosensitive layer soluble or dispersible in ink and/or fountain solution and capable of hardening upon exposure to a laser having a wavelength selected from 200 to 1200 nm; wherein said aluminum substrate is electrochemically gained, anodized, and further treated with a phosphate fluoride aqueous solution, and has a reflection optical density of at least 0.30;
   (b) imagewise exposing said plate with said laser to cause hardening of the photosensitive layer in the exposed areas;
   (c) heating said exposed plate to 50 to 200° C. for 1 to 300 seconds; and
   (d) developing said heated plate with ink and/or fountain solution on a lithographic press to remove the non-hardened areas of the photosensitive layer.

2. The method of claim 1 wherein said substrate has a reflection optical density of from 0.32 to 0.70.

3. The method of claim 1 wherein said substrate has a reflection optical density of from 0.34 to 0.60.

4. The method of claim 1 wherein said substrate has a reflection optical density of from 0.36 to 0.50.

5. The method of claim 1 wherein said substrate has an average surface roughness Ra of from 0.30 to 0.60 μm.

6. The method of claim 1 wherein said photosensitive layer comprises a polymeric binder and a sensitizing dye or pigment.

7. The method of claim 1 wherein said photosensitive layer comprises a polymerizable monomer, an initiator, and a sensitizing dye; and is capable of hardening through polymerization upon exposure with said laser.

8. The method of claim 1 wherein said photosensitive layer comprises a polymeric binder, a monomer having at least 3 (meth)acrylate groups, a free radical initiator, and a sensitizing dye; wherein the weight ratio of all the monomers having at least 3 (meth)acrylate groups to all the polymeric binders is larger than 1.0.

9. The method of claim 1 wherein said plate further comprises an ink and/or fountain solution soluble or dispersible overcoat on said photosensitive layer.

10. The method of claim 1 wherein said plate is exposed with an infrared laser having a wavelength of from 750 to 1200 nm.

11. The method of claim 1 wherein said plate is exposed with a violet or ultraviolet laser having a wavelength of from 200 to 430 nm at a dosage of less than 1000 μJ/cm$^2$.

12. The method of claim 1 wherein said plate is applied with a deactivating agent after said laser exposure and before said development.

* * * * *